United States Patent [19]
Chakradhar et al.

[11] Patent Number: 5,726,996
[45] Date of Patent: Mar. 10, 1998

[54] PROCESS FOR DYNAMIC COMPOSITION AND TEST CYCLES REDUCTION

[75] Inventors: Srimat T. Chakradhar, North Brunswick; Anand Raghunathan, Edison, both of N.J.

[73] Assignee: NEC USA, Inc., Princeton, N.J.

[21] Appl. No.: 529,940

[22] Filed: Sep. 18, 1995

[51] Int. Cl.$^6$ .................................................. G01R 31/28
[52] U.S. Cl. ........................................ 371/22.1; 371/27
[58] Field of Search ............................. 371/22.1, 27, 23, 371/25.1, 22.3; 395/500, 183.06; 364/717, 718, 488; 324/765, 73.1

[56] References Cited

U.S. PATENT DOCUMENTS

| | | | |
|---|---|---|---|
| 5,414,716 | 5/1995 | Bershteyn | 371/27 |
| 5,418,792 | 5/1995 | Maamari | 371/23 |
| 5,502,730 | 3/1996 | Roy et al. | 371/22.3 |
| 5,522,063 | 5/1996 | Ashar et al. | 395/500 |

OTHER PUBLICATIONS

Rabindra K. Roy, Tom. M. Niermann, janak H. Patel, Jacob A. Abraham, and Resve A. Saleh; Compaction of ATPG–Generated Test sequences for sequential circuits; IEEE/IEE Pub. 1988; pp. 382–385.

Jhiang–Fa Wang et al; Test generation for presettable synchronous sequential circuits; IEEE Trans. on computers; pp. 155–158, Oct., 1988.

Hi–Keung Tony et al; Test generation for sequential circuits; pp. 1081–1093, Oct., 1988.

T.M. Niermann et al, "Test Compaction for Sequential Circuits," IEEE Trans. on Computer–Aided Design, vol. 11, No. 2, Feb. 1992, pp. 260–267.

S.Y. Lee et al "Sequential Test Generation with Reduced Test Clocks," Proc. of VLSI Test Symposium, Apr. 1994, pp. 220–225.

E.M. Rudnick et al, "A Genetic Approach to Test Application Time Reduction for Full Scan and Partial Scan Circuits," in Proc. of 8th Int'l Conf. On VLSI Design, Jan. 1995, pp. 288–293.

S. Kajihara et al, "On Compacting Test Sets by Addition and Removal of Test Vectors," in Proc. of VLSI Test Symposium, Apr. 1994, pp. 202–207.

M.H. Schulz et al, "SOCRATES: A Highly Efficient Automatic Test Pattern Generation System," IEEE Trans. on Computer–Aided Design, vol. 7, No. 1, Jan. 1988, pp. 126–137.

S.T. Chakradhar et al, "A Transitive Closure Algorithm for Test Generation," IEEE Trans. on Computer–Aided Design of Integrated Circuits & Systems, vol. 12, No. 7, Jul. 1993, pp. 1015–1028.

Y. Higami et al, "Reduced Scan Shift: A New Testing Method for Sequential Circuits," Proc. of Int'l Test Conference 1994, Oct. 1994, pp. 624–630.

S.B. Akers et al, "Why is Less Information From Logic Simulation More Useful in Fault Simulation?" Proc. of 1990 Int'l Test Conference, pp. 786–800.

S. Kajihara et al, "Cost–Effective Generation of Minimal Test Sets for Stuck–at Faults in Combinational Logic Circuits," Proc. of 30th ACM/IEEE Design Automation Conference, Jun. 1993, pp. 102–106.

*Primary Examiner*—Robert W. Beausoliel, Jr.
*Assistant Examiner*—Nadeem Iqbal
*Attorney, Agent, or Firm*—Jeffery J. Brosemer; Arthur J. Torsiglieri

[57] ABSTRACT

A new dynamic process for test sequence compaction and test cycle reduction that identifies bottlenecks that prevent vector compaction and test cycle reduction for test sequences generated initially and generates subsequent test sequences with the aim of eliminating bottlenecks of the initially generated test sequences. To apply the process to sequential circuits, a sliding anchor frame technique is used that involves specifying the unspecified bits of a partially specified test sequence to detect other faults.

3 Claims, 12 Drawing Sheets

| Vector | G0 | G1 | G2 | G3 | G5 | G6 | G7 |
|--------|----|----|----|----|----|----|----|
| 1 | 0 | 0 | 0 | 0 | 0 | 0 | 1 |
| 2 | 1 | 1 | 0 | 0 | 0 | 1 | 0 |
| 3 | 0 | 0 | 0 | 0 | 0 | 1 | 0 |
| 4 | 0 | 0 | 1 | 1 | 0 | 0 | 1 |

| G0 | G1 | G2 | G3 | G5 | G6 | G7 |
|----|----|----|----|----|----|----|
| x  | 0  | 1  | 1  | 0  | 0  | 1  |

FIG. 3

| Sequence | G0 | G1 | G2 | G3 |
|----------|----|----|----|----|
| 1        | 0  | 1  | 1  | 0  |
|          | 1  | 0  | 1  | 1  |

FIG. 4

| Sequence | G0 | G1 | G2 | G3 |
|----------|----|----|----|----|
| 2        | 1  | x  | 0  | 0  |
|          | 0  | x  | 1  | 1  |
|          | x  | 0  | x  | 1  |

FIG. 5

| Sequence | G0 | G1 | G2 | G3 |
|---|---|---|---|---|
| 2 | 1 | 1 | 0 | 0 |
|   | 0 | 1 | 1 | 1 |
|   | 1 | 0 | 1 | 1 |

FIG. 6

| Vector | G0 | G1 | G2 | G3 | G5 | G6 | G7 |
|---|---|---|---|---|---|---|---|
| 1 | 0 | 1 | 1 | 1 | 0 | 0 | x |
| 2 | 1 | x | x | x | x | x | x |

FIG. 7

| Vector | G0 | G1 | G2 | G3 | G5 | G6 | G7 |
|---|---|---|---|---|---|---|---|
| 1 | x | 1 | 1 | x | x | x | x |
| 2 | 1 | 1 | 0 | x | x | x | x |

FIG. 8

| Vector | G0 | G1 | G2 | G3 | G5 | G6 | G7 |
|---|---|---|---|---|---|---|---|
| 1 | 0 | x | x | x | x | 0 | x |

FIG. 9

| Vector | G0 | G1 | G2 | G3 | G5 | G6 | G7 |
|---|---|---|---|---|---|---|---|
| 1 | 0 | x | x | x | x | x | x |
| 2 | 1 | x | x | x | x | x | x |

FIG. 10

```
Procedure BOTTLENECK_FRAMEWORK(circuit, faultlist)
{
1.    while (undetected faults exist){
2.        Pick next undetected fault.
3.        Generate test sequence $T_{current}$.
4.        EXTEND_SEQUENCE($T_{current}$)
5.        ELIMINATE_BOTTLENECKS($T_{current}$)
6.        Fault simulate test sequence $T_{current}$.
7.        while (a prior test sequence $T_{prior}$ has no bottlenecks) {
8.            Drop or trim test sequence $T_{prior}$.
9.            RECOMPUTE_BOTTLENECKS()
          }
10.       COMPUTE_SEQUENCE_BOTTLENECKS($T_{curent}$)
}
```

FIG. 11

| Sequence | G0 | G1 | G2 | G3 | G4 |
|---|---|---|---|---|---|
| 1 | x | x | 1 | x | 1 |
| | x | 0 | x | 1 | x |

| Sequence | G0 | G1 | G2 | G3 | G4 |
|---|---|---|---|---|---|
| 1 | 1 | x | 1 | 0 | 1 |
|   | x | 0 | x | 1 | x |

| G0 | G1 | G2 | G3 | G5 | G6 | G7 |
|----|----|----|----|----|----|----|
| 1  | x  | 0  | 0  | 1  | 0  | x  |

Procedure COMPUTE_SUPPORT_SET (primary output list $L$)
{
    support set $S \leftarrow \phi$.
    for (every output in list $L$){
        Add primary output to set $S$.
        Insert output with level $i$ into list $Larr[i]$.
    }
    for (every list $l$ from $Larr[Maxlevel]$ to $Larr[1]$){
        for (each gate $g$ in list $l$){
            Determine support signals for gate $g$.
            Add support signals to $S$ and
            to the appropriate list in $Larr$.
        }
    }
    return support set $S$.
}

FIG. 20

| Sequence | $G0$ | $G1$ | $G2$ | $G3$ |
|---|---|---|---|---|
| 1 | 1 | x | 1 | 0 |
|   | x | 0 | x | 1 |

FIG. 21

| G0 | G1 | G2 | G3 | G5 | G6 | G7 |
|----|----|----|----|----|----|----|
| 0  | 0  | 0  | 0  | 0  | x  | x  |

1

PROCESS FOR DYNAMIC COMPOSITION AND TEST CYCLES REDUCTION

FIELD OF THE INVENTION

This invention relates to the automatic testing of integrated circuits and more particularly to a process for developing test sets involving fewer test vectors to increase the rate of testing.

BACKGROUND OF THE INVENTION

Because the testing of an integrated circuit ordinarily cannot include probing at internal nodes of the integrated circuit, testing is generally done by applying to the primary inputs of the circuit a test vector, which is a set of logic values designed to test for one or more specific faults, and observing the resulting logic values at its primary outputs. Moreover, hardware modifications like full or partial scan designs are being widely used to alleviate the difficult problem of generating suitable sets of test vectors for the testing. The use of such modifications has tended to increase the size of the test sets needed to test a circuit, which in turn has increased the time and cost of such testing.

Reductions in test application time and test set size are highly desirable in order to minimize the overall costs incurred in fabricating and testing a large number of chips that implement a specific design. Small test sets are necessary because testers have a fixed memory size. The application of a test set larger than the tester memory size will require repeated loading of the tester memory, which is at best an expensive process. Reduced test application time is desirable since the cost of applying a test set increases with the number of tester cycles needed to apply the test set. Hardware modifications, like full or partial scan, that are employed to ease the task of test generation significantly increase the test application time. These design modifications render all or a subset of flip-flops (FFs) to be completely controllable and observable. This implies that arbitrary logic values can be loaded into the scan FFs and that circuit responses collected in any of the scan FFs can be observed. The increase in test application time is mainly due to the extra tester clock cycles needed to load specific logic values into scan FFs and observe circuit responses collected in the scan FFs.

For full-scan design circuits, the number of tester clock cycles required for a given test set is given by the equation $$Test\ Cycles = V.F + V + F \qquad (1)$$

where V is the number of vectors in the test set, and F is the number of scan FFs in the design. The amount of tester memory required to store a test set depends on the exact tester architecture. For some tester architectures, each scan vector is expanded into F+1 vectors and stored. For such architectures, the tester memory required is equal to the product of the test cycles required and the number of bits per vector. For other tester architectures, the tester memory required is given by the product of the number of vectors in the test set and the number of bits per vector. In order to reduce both test application time and meet tester memory requirements for full scan designs, several combinational test generators aimed at generating test sets that contain fewer vectors have been developed. These methods can be classified as static or dynamic. Static methods attempt to reduce the number of vectors in an already generated test set. Dynamic methods consider vector compaction during the generation of the test set. Other methods to reduce test application time have been proposed that design the scan path so as to reduce the number of cycles required to scan-in a vector or scan out the circuit response. These methods include multiple scan chains and parallel scan, parity scan design, selectable length partial scan, scan chain ordering, and reconfigurable scan chains. The reduction in test application obtained by such methods is over and above the reduction obtained by test generation based methods. Methods to produce circuits that inherently require smaller test sets (test sets with fewer vectors) during the logic synthesis process have been proposed.

Hybrid test generation approaches employing both combinational and sequential test generation methods have been investigated to reduce the test application time of full-scan designs, by using the scan chain to control and/or observe FFs only when required. The test sets generated by these methods consist of vectors that have to be scanned in, and vectors that do not require any scan in (the latter type of vectors are generated using a sequential circuit test generator). A recent technique recognized that full-scan in of the vector or full-scan out of the circuit response may be an overkill for many vectors. They propose a static method of test cycle reduction based on the partial scan-in and scan-out of test vectors and circuit response, respectively. They also re-order the FFs in the scan chain to reduce the test application cycles required for a given test set.

For sequential circuits with no or little scan, very few methods have been proposed to reduce the size of the test set or test application cycles. A paper by T. M. Niermann et al, entitled "Test Compaction for Sequential Circuits," in IEEE Transactions on Computer-Aided Design, vol. 11, pp. 260–267, February 1992, describes static compaction techniques for sequential circuits. Recently, dynamic methods for reducing test application cycles in partial-scan design circuits have been suggested in a paper by S. Y. Lee et al, entitled "Sequential Test Generation with Reduced Test Clocks for Partial Scan Designs," in VLSI Test Symposium, pp. 220–225, April 1994, and in a paper by E. M. Rudnick et al, entitled "A Genetic Approach to Test Application Time in Full Scan Designs," in Proc. of the International Conference on Computer-Aided Design, pp. 17–20, November 1992. However, to the best of our knowledge, no dynamic compaction method for sequential circuits has been reported in the literature.

SUMMARY OF THE INVENTION

The novel process of the present invention is based on two key features. (1) As we proceed with the generation of test sequences, we identify bottlenecks that prevent vector compaction and test cycle reduction for the test sequences generated thus far, and (2) future test sequences are generated with an attempt to eliminate bottlenecks of earlier generated test sequences. Since the dynamic process relies on identification and elimination of test sequence bottlenecks, we refer to our method as the bottleneck elimination framework. If a newly generated test sequence eliminates bottlenecks of an earlier test sequence, we drop the earlier sequence. The dropped sequence is not included in the final test set. We demonstrate that vector compaction and test cycle reduction can be conflicting goals. For sequential circuits, we propose a sliding anchor frame technique to extend partially specified test sequences in order to detect other faults. Under the sliding anchor frame technique, every vector in the partially specified test sequence being extended is considered as an anchor vector during the extension of the sequence. Our process generates minimal test sets because static vector compaction or test cycle reduction using set-covering or extended set-covering approaches (for example, reverse or any other order of fault simulation along with any specification of unspecified values) cannot further reduce the number of vectors or test cycles. The bottleneck elimination framework can be used in conjunction with any combinational or sequential test generator and fault simulator. Though we only consider the stuck-at fault model here, our framework can be used to generate test sets with reduced vectors and test cycles for other fault models as well.

For full-scan design circuits, our approach results in test sets that are comparable in size to the best known test sets derived using dynamic compaction methods. For a few circuits, the bottleneck approach results in smaller test sets than the test sets obtained using existing dynamic compaction approaches. Moreover, the test sets derived using the bottleneck framework can be be further reduced using static post-test generation compaction techniques that generate entirely new test vectors, for example as are described in a paper by S. Kajihara et al, entitled "On Compacting Test Sets by Addition and Removal of Test Vectors," in VLSI Test Symposium, pp. 202-207, April 1994.

Test generators that use dynamic or static compaction techniques can require significantly more computing resources than those that do not attempt vector compaction.

The increase in computation times is mainly due to the large number of faults that have to be processed by a test generator that also performs vector compaction.

Too high computation times may preclude the use of these methods for large production VLSI circuits. It is possible to reduce the computation times by settling for larger test sets (i.e., trade off test generation time for test set size).

As an additional feature of the invention for use where excessive computation time becomes a limiting factor, we have devised acceleration techniques that can reduce computation time for vector compaction without significantly compromising the quality of the test sets obtained. In particular, we use support sets for reducing the number of faults that needed to be processed by the test generator or a fault simulator or both for combinational or sequential circuits.

A support set is a set of signals that satisfy a special set of conditions as will be discussed in more detail hereinafter.

The invention will be better understood from the following more detailed discussion taken in connection with the accompanying drawing.

BRIEF DESCRIPTION OF THE DRAWING

FIG. 1 is a sequential circuit used in describing an illustrative example of the practice of the invention for deriving test sets;

FIGS. 2–10 are tables of test sets of vectors applicable for testing for the various faults indicated in the circuit of FIG. 1;

FIG. 11 is the pseudo-code for the basic process of the invention;

FIG. 20 shows the pseudo-code for computing SUPPORT SET.

FIG. 21 is a test sequence for a particular fault in the circuit of FIG. 1.

DETAILED DESCRIPTION OF THE INVENTION

Figures 1, 2:
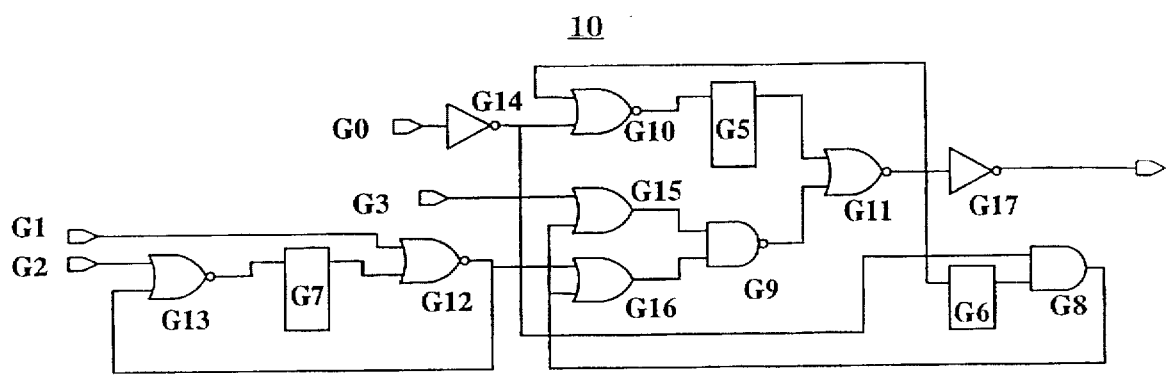

It will be helpful to begin by reviewing the terminology to be used. A test vector is a set of logic values (0, 1, or X) that are simultaneously applied to the primary inputs of the circuit. A test sequence is an ordered set of test vectors that detect a target fault. A test set is an unordered set of test sequences. For full scan design circuits, a test sequence consists of only one test vector. The size of a test sequence is the number of test vectors in the sequence. The size of a test set is the number of vectors in all its test sequences. Given a test set, a fault is essential if only one test sequence can detect the fault. Such faults can be easily identified during fault simulation by dropping a vector for a fault only after the fault has been detected twice. Any static procedure that attempts to reduce the number of vectors or test application cycles in a test set by selecting a subset of test sequences from the given set that detect all target faults will be referred to as a subset-selection approach. An example of a method that uses the subset-selection approach is the technique of fault simulating the test sequences in reverse order of their generation (as described in a paper by M. H. Schulz et al, entitled "SOCRATES: A Highly Efficient Automatic Test Pattern Generation System," in IEEE Trans. on Computer-Aided Design, vol. 7, pp. 126–136, January 1988) or any other order, and dropping test sequences that do not detect any additional faults. A subset selection approach that is also allowed to specify unspecified values in test sequences solely by merging multiple test vectors or sequences into a single sequence, as is described below, is called a set-covering approach. A subset-selection approach that is allowed to change test sequences by arbitrarily specifying a 0 or 1 value for each unspecified input is referred to as an extended set-covering approach (for example, an extended set-covering approach could use a test generator to judiciously specify the unspecified values in a vector or sequence to detect other faults). A test set is optimal with respect to a subset-selection, set-covering or extended set-covering approach if none of its vectors or sequences can be dropped by a subset-selection, set covering or extended self-covering approach, respectively. A test set in which each vector or sequence detects an essential fault is optimal with respect to any subset-selection approach.

Vector Compaction Bottlenecks

For the sake of clarity, we illustrate vector compaction bottlenecks in combinational (full scan) circuits and sequential (partial or non scan) circuits separately. Consider a test set for a full-scan design circuit. Assume that every test vector in the test set is fully specified. If every test vector detects an essential fault, then the test set cannot be further reduced using any set-covering approach. This is because every test vector detects an essential fault and dropping a vector from the test set will result in a decrease in fault coverage. Note that since all vectors are fully specified, merging of two vectors is possible only if they are identical. However, no two vectors can be identical since that contradicts the assumption that each vector detects an essential fault.

It is known that if some vectors in the test set are partially specified, it is possible to merge two vectors into a single vector. This merging is possible if the corresponding primary inputs of the two vectors do not have conflicting value assignments. However, if the test set does not have a pair of vectors that can be merged, then the size of this test set cannot be further reduced using a set-covering approach. These observations suggest two bottlenecks that prevent dropping of a test vector from a given test set:

CB1. The test vector detects one or more essential faults.

CB2. The test vector cannot be merged with any other test vector in the test set.

If a vector does not satisfy condition CB1, then it can be dropped from the test set. Note that it is possible for a test vector to satisfy condition CB1 but violate condition CB2. If this happens, then the test vector can be merged with another vector in the test set. The essential faults for the test vector are also essential faults for the merged vector.

Lemma 1: A test vector belongs to the optimal test set computed by a set-covering approach if and only if the test vector satisfies conditions CB1 and CB2.

For partial-scan or non-scan design circuits, a target fault may require a test sequence consisting of more than one vector. Consider a test set that detects all target faults. Furthermore, assume that no test sequence in this set is an ordered subsequence of any other test sequence. If test vectors have unassigned values (X), assume that no assignment of values to the unassigned signals will result in any test sequence becoming an ordered subsequence of any other test sequence. If every test sequence detects an essential fault, then, again, no set-covering approach can further reduce the number of test sequences or test vectors in the test set. These observations translate into the following bottlenecks that prevent a test sequence from being dropped from a test set:

SCB1. The test sequence detects one or more essential faults.

SCB2. The test sequence is not an ordered subsequence of any other test sequence in the test set.

Lemma 2: A test sequence belongs to the optimal test set computed by a set-covering approach if and only if the test sequence satisfies conditions SCB1 and SCB2.

After identifying the bottlenecks for a test sequence, future test sequences can be generated with an attempt to eliminate the bottlenecks of the test sequence. We illustrate this idea using separate examples for full-scan design and non-scan design circuits.

Example 1

Consider the circuit 10, shown in FIG. 1, which is circuit s27 of the ISCAS-89 benchmark set. This circuit has three FFs (flip-flops) (G5, G6 and G7), four primary inputs (G0, G1, and G2 and G3), and one primary output (G17). If we assume that all three FFs have been scanned, then the full-scan design circuit now has three new primary inputs (G5, G6 and G7) and three new primary outputs (G10, G11 and G13). Table 1 of FIG. 2 shows the first three test vectors produced for the circuit 10 by the test generator TRAN (described in a paper by S. T. Chakradhar et al. entitled "A Transitive Closure Algorithm for Test Generation," IEEE Trans. on Computer-Aided Design, vol. 12, pp. 1015–1028, July 1993). At this point, every one of the three vectors has an essential fault. For example, vectors 1, 2 and 3 detect essential faults G6 s-a-1, G14 s-a-1, and G12 s-a-0, respectively. Also, no vector of the first three can be merged with either of the other two vectors. Therefore, conditions CB1 and CB2 are satisfied for every one of these vectors. Consider test vector 1. It detects three essential faults: G6 s-a-1, G7 s-a-0 and G14→G10 s-a-0 (these faults are not detected by test vectors 2 or 3). To drop test vector 1, future test vectors will have to eliminate the bottlenecks of vector 1. TRAN next selects the target fault G2 s-a-0 (since it has not yet been detected), and generates the test vector shown in Table 2 of FIG. 3. This vector has an unspecified value. Fault simulation reveals that it also detects all the essential faults of vector 1 except G6 s-a-1. Furthermore, specifying G0 to a 0 or 1 does not detect any additional undetected faults. To eliminate vector 1, we attempt to extend the vector of Table 2 of FIG. 3 to detect the bottleneck fault G6 s-a-1. TRAN targets the fault G6 s-a-1 and succeeds in extending the current vector to detect this fault. The extended vector is shown as vector 4 in Table 1 of FIG. 2. Since the bottleneck CB1 for test vector 1 has been eliminated, we drop the vector.

Example 2

Consider again the circuit 10 of FIG. 1. Assume that no FFs are scanned. A commercial sequential test generator targets the fault G17 s-a-0 and generates the test sequence shown in Table 3 of FIG. 4.

We will refer to this sequence as the first sequence. The next target undetected fault selected by the test generator is G11→G10 s-a-0 and for this fault the test generator generates the sequence shown in Table 4 of FIG. 5.

This sequence has several vectors with unspecified values. This flexibility can be utilized to eliminate the bottlenecks of the first sequence. Fault simulation of the sequence in Table 4 of FIG. 5 reveals that all but one (G12→G13 s-a-0) of the essential faults of the first sequence are detected. Now, to eliminate the bottlenecks of the first sequence, we attempt to extend the current test sequence to detect the remaining essential fault G12→G13 s-a-0 of the first sequence. The test generator successfully extends the test sequence to obtain the sequence shown in Table 5 of FIG. 6.

Since the bottleneck SCB1 for the first sequence has been completely eliminated, we drop the first sequence. It is interesting to note that sequence 1 is not a sub-sequence of sequence 2 but it can nevertheless be dropped from the test set.

Test Cycle Bottlenecks

For a non-scan circuit, the number of test cycles required to apply the test set is equal to the number of test vectors in the test set. Therefore, reducing the number of test vectors will also reduce the test application cycles. However, for partial or full-scan design circuits, the number of test application cycles is significantly greater than the number of test vectors in the test set. This is because additional test application cycles are required to scan in the values of scan FFs and scan out the circuit responses stored in the scan FFs. The number of test application cycles needed for full scan designs is given by equation 1 that is set forth above. Reducing the number of scanned FFs reduces the number of cycles needed to scan in or scan out the values of FFs, but may result in an increase in the number of vectors, and a decrease in the attainable fault coverage. The above analysis assumes that every FF value is scanned in and scanned out for each vector. However, it may not be necessary to scan-in values for all scan FFs or scan-out values of all scan FFs as suggested in a paper by Y. Higami et al. entitled "A Reduced Scan Shift Method for Sequential Circuit Testing," in Proc. of the International Test Conference, pp. 624–630, October 1994.

Under the partial scan-in and scan-out model, test sets with the same number of test vectors may require significantly different number of test application cycles. In the case of full-scan designs, only those FF values that need to be controlled (observed) in order to maintain the coverage of the test set are scanned in (out) for each test vector. The exact number of scan-in or scan-out cycles required for a given test vector can be determined based on the essential faults of the vector and the order of FFs in the scan chain. As a result, it is possible to re-order the scan chain in order to reduce the test application cycles required for a given test set. However, this incurs additional overheads since the order of FFs in the scan chain is usually decided based on the layout constraints for the design. Another result of using the partial scan-in and scan-out approach is that the scan-out cycles of a vector and the scan-in cycles of the next vector are not necessarily the same. Thus, the test application cycles of a test set also depends on the order of application of the test vectors. The test application cycles of a test set under the partial scan-in and scan-out model can be calculated as $$\text{Test Cycles} = V + SI_1 + \sum_{i=1}^{V-1} Max(SO_i, SI_{i+1}) + SO_V \quad (2)$$

where V is the number of vectors in the test set, and $SI_i$ and $SO_i$ represent the number of scan-in and scan-out cycles for vector i, respectively.

Example 3

Consider again the full-scan design version of circuit 10 of FIG. 1. For this design, assume that FF G7 is connected to the scan-in pin and FF G6 is connected to the scan-out pin. Therefore, three test cycles are required to load a desired value into FF G6. Only one test cycle is required to observe the circuit response stored in FF G6. Similarly, only one test cycle is required to load the desired value into FF G7 but three test cycles are required to observe the response stored in FF G7.

Consider a target fault set consisting of the following three faults: G2→G13 s-a-0, G12 s-a-1 and G14→G10 s-a-1. A possible test set for these faults is shown in Table 6 of FIG. 7. Test vector 1 detects the first two faults. This vector will require three test cycles to load the desired values into FFs G5 and G6. One test cycle is used to apply the primary input values and to allow the circuit to respond to the input stimulus. This test vector also requires observation of circuit response stored on signals G13 and G17. Three test cycles are required to observe the value on signal G13. Therefore, seven test cycles are required for the application of this test vector. The second test vector detects the remaining fault G14→G10 s-a-1. This vector does not require any specific values to be loaded into the scan FFs. One test cycle is required to apply the vector. Since the fault is detectable at the pseudo primary output G10, two additional test cycles are required to observe the value of signal G10. Therefore, the test set of Table 6 of FIG. 7 requires 10 test application cycles.

An alternative test set for the target faults is shown in Table 7 of FIG. 8. This test set also has two vectors. However, the first test vector detects the fault G2→G13 s-a-0 and the second vector detects the remaining faults. The first vector requires no scan-in cycles. One test cycle is required to apply the primary inputs and three cycles are required to observe the response at signal G13. The second test vector also requires no scan-in cycles. It requires one cycle to apply the primary input values and two cycles to observe the faulty response at signal G10. In all, the test set of Table 7 requires 7 test cycles. Thus, test sets that contain the same number of test vectors can require significantly different test application cycles.

Both test vectors in the test set of Table 6 as well as of Table 7 exhibit the following characteristics:

1. The vector detects at least one essential fault.
2. The maximum scan-in or scan-out cycles needed to set up or observe the circuit response, respectively, is required for the detection of essential faults covered by the vector.

If a test vector detects a fault, it is possible that detection of the fault is not compromised when some of the scan FF values are left unspecified. This will modify the vector and may result in a new vector that requires fewer scan cycles. Similarly, it is possible that the detection of the fault is not compromised if the circuit response on selected state bits is not observed. A fault is a scan-in bottleneck for a vector if no scan FF values can be unspecified to reduce the scan in cycles required by the vector. Scan FF values are unspecified without compromising the detection of the fault. A scan-out bottleneck for a vector is defined by a similar analysis for scan-out case where detection of the fault is compromised when circuit response in some of the scan FFs is not observed. Note that a vector can have multiple scan-in bottlenecks and multiple scan-out bottlenecks. A fault is a scan bottleneck for a vector if it is either a scan-in or scan-out bottleneck for the vector. Scan-in, scan-out, and scan bottlenecks are similarly defined for test sequences in partial scan circuits.

The bottlenecks that prevent further reduction in the number of test application cycles required by a single test vector are as follows:

TCB1. The vector detects one or more essential faults.

TCB2. At least one scan-in and one scan-out bottleneck of the vector are essential faults.

If condition TCB1 is violated, then the vector can be dropped and no scan-in cycles are required. If condition TCB2 is violated, then the vector can be trimmed to reduce the scan-in or scan-out cycles required by the vector. Trimming involves either unspecifying state bits in the test vector or not observing the circuit response at selected state variables, so that the new vector still detects all essential faults covered by the original vector. For a given test set, the larger of test cycles needed for scan-in of all test vectors and the test cycles needed for scan-out of all test vectors is clearly a lower bound on the test cycles required for the test set. In practice, we have observed that the number of test cycles required to scan-in all test vectors in a test set is significantly higher than the number of test cycles required to scan-out the relevant circuit responses for all test vectors. Therefore, vectors with lower scan-in are preferable to vectors that require higher scan-in. This observation could be used to reduce the computational effort involved in maintaining and processing bottlenecks with negligible effect on test application cycles.

Since test sets that contain the same number of vectors can require vastly different numbers of test application cycles, optimizing a test set for size is different from optimizing for test application cycles. In order to optimize a test set for test application time, we need to consider test cycle bottlenecks as well during the test generation process. Future test vectors can be generated with an aim to eliminate test cycle bottlenecks of already generated test vectors, as illustrated by the next example.

Example 4

As an example, consider again the first vector in the test set shown in Table 6 of FIG. 7. The first vector detects two essential faults and the fault G12 s-a-1 requires that the state bit G6 be set to a particular value. Therefore, detection of this essential fault requires three scan-in cycles and this fault is a bottleneck for further reducing the scan-in requirement of the vector. The second test vector in Table 6 has several unspecified primary inputs and state bits. This flexibility can be used to extend the vector to eliminate the bottlenecks of the first vector. In particular, the second vector can be extended to detect the fault G12 s-a-1. The extended vector is identical to vector 2 in the test set shown in Table 7. Now, the fault G12 s-a-1 is no more an essential fault for vector 1. Therefore, this vector can be trimmed by un-specifying state bits G5 and G6. The trimmed vector is identical to the first vector in the test set of Table 7 of FIG. 8.

Lemma 3: Consider a test set, obtained using set-covering and trimming, that requires the least number of test application cycles. A test vector belongs to this test set if and only if the vector satisfies conditions TCB1 and TCB2.

For partial-scan circuits, a test sequence may consist of a series of vectors. The scan-in cycles required by the test sequence is the sum of scan-in cycles required by each vector in the sequence. If the sequence satisfies the following conditions, then the scan-in cycles required by the sequence cannot be reduced by trimming:

STCB1. The sequence detects one or more essential faults.

STCB2. Trimming any vector in the sequence will cause an essential fault to be undetectable by the sequence.

Vector Compaction vs. Test Cycle Reduction

For partial or full-scan designs, the smallest test set may not always require the least number of test cycles.

Example 5

Consider the following two faults in the circuit of FIG. 1: G10 s-a-1 and G17 s-a-0. If we assume that all FFs are scanned, then a possible test vector that detects both faults is shown in Table 8 of FIG. 9. This test vector requires three scan-in cycles, one cycle to apply the primary inputs and two scan-out cycles. Thus, the test set shown in Table 8 requires 6 test application cycles. An alternative test set that contains more vectors but requires fewer test application cycles is shown in Table 9 of FIG. 10. Test vector 1 detects the fault G10 s-a-1. This vector requires no scan-in cycles, one cycle to apply the primary input values and two scan-out cycles to observe the response at signal G10. The second vector detects the fault G17 s-a-0. This vector also requires no scan-in cycles, one cycle to apply the primary input values and no scan-out cycles since G17 is a primary output. In all, the test set shown in Table 9 requires 4 test application cycles.

Bottleneck Elimination Framework

A dynamic optimization framework that attempts to eliminate test sequence bottlenecks is embodied in the procedure BOTTLENECK_FRAMEWORK, that is shown in pseudo-code in FIG. 11. The framework can be used to either optimize test set size or the test application cycles required by a test set. The process begins by selecting an undetected target fault. A test generator is used to generate the test sequence for such fault. No restrictions are placed on the test generation algorithm or the heuristics employed by the test generator. Typically, not all primary inputs and scan FFs have to be assigned values 0 or 1 to detect the target fault. We assume that the test generator does not randomly assign values to primary inputs and scan FFs that were left unspecified in the test sequence. Ideally, the test generator should assign values to as few primary input signals and scan FFs as possible to detect the target fault. Though not attempted here, it is possible to judiciously un-specify bits that were unnecessarily specified during test generation.

The test sequence is fault simulated to identify other fortuitously detected faults. A fault is dropped during fault simulation only after it has been detected twice. This is unlike the more conventional fault simulation where a fault is dropped after it has been detected once. The list of essential faults for the prior test sequences can be incrementally updated during the fault simulation of the current test sequence. The fault simulator records the first and second test sequence, if any, that detect a fault. Therefore, given a fault, it is easy to identify if it is an essential fault. Also, the information about the test sequence that detects the fault is readily available.

The unspecified signal values in the test sequence can be suitably specified to detect remaining undetected target faults. We will refer to this test sequence as the primary test sequence. The procedure EXTEND_SEQUENCE uses a test generator to suitably specify the unspecified signals in the primary test sequence. The test sequence obtained after specifying unspecified signals in the primary test sequence is called the secondary test sequence. During this phase, the test generator may or may not increase the number of vectors in the test sequence. In full-scan design circuits, the primary sequence for any stuck-at fault has only one vector. Also, detection of any target stuck-at fault will require at most one vector. Therefore, the primary and secondary test sequences have only one vector. For partial or non-scan circuits, the secondary test sequence can have more vectors than the primary test sequence. However, the primary test sequence is a subsequence of the secondary test sequence. Note that the primary test sequence detects at least one fault that is not detected by any of the prior test sequences. Therefore, the secondary test sequence cannot be dropped because of the bottleneck CB1 or SCB1.

The procedure ELIMINATE_BOTTLENECKS attempts to further extend the primary test sequence. However, the goal this time is to eliminate essential faults that are bottlenecks of prior test sequences. A possible order for considering the prior test sequences is to sort them based on increasing number of essential faults. A test sequence with the fewest essential faults can be selected and the test generator attempts to extend the current sequence to detect these essential faults. During this phase, we record the test sequences whose bottlenecks have been eliminated. These sequences are possible candidates that can be dropped or trimmed. Note that it is not possible to simultaneously drop or trim all these sequences. For example, assume that sequences $T_1$ and $T_2$ have been shortlisted to be dropped.

Consider a fault f that is only detected by sequences $T_1$ and $T_2$. This fault is not an essential fault since it is detected by two sequences. Therefore, this fault is not a bottleneck for either $T_1$ or $T_2$. However, simultaneous dropping of both sequences will result in a loss of fault coverage since the fault f is not detectable by any prior test sequence. If simultaneous dropping of test sequences is desired, then some of the detected faults will now become undetected. These newly undetected faults need be fortuitously detected during fault simulation of future test sequences or they will have to be explicitly targeted by a test generator. Trimming a sequence has similar ramifications.

Whenever a test sequence is dropped or trimmed, this changes the compaction bottlenecks and test cycle bottlenecks of other already generated test sequences. Consider the dropping of test sequence $T_i$. Only non-essential faults that are detected for the first or second time by the test sequence $T_i$ (double detected faults) could possibly become essential faults. Whether these faults are essential or not can be determined quickly, as follows. Since fault simulation records the first and second test sequence, if any, that detect every fault, we can easily compute the earliest test sequence $T_j$ that detects any of these non-essential faults. Bottleneck statistics of sequence $T_j$ and earlier sequences remain unchanged. We fault simulate only test sequences generated after test sequence $T_j$ with the non-essential faults of $T_i$ as the target fault list. We now have accurate information about the essential faults and we update the bottleneck statistics of these test sequences.

If every prior test sequence has bottlenecks that could not be eliminated by the current test sequence, then the procedure COMPUTE_SEQUENCE_BOTTLENECKS determines the bottlenecks for the current test sequence. The essential fault list for this vector is readily available from fault simulation. If test cycle reduction is desired, then scan bottlenecks are also computed by procedures RECOMPUTE_BOTTLENECKS and COMPUTE_SEQUENCE_BOTTLENECKS, and procedure ELIMINATE_BOTTLENECKS also considers the scan bottlenecks of earlier generated test sequences while extending the current test sequence.

Sliding Anchor Frame Technique

Procedures EXTEND_SEQUENCE and ELIMINATE_BOTTLENECKS involve the extension of a partially specified test sequence to detect additional faults. We refer to this process as secondary test generation. Secondary test generation is performed by treating the values that are specified as constraints during test generation. For combinational circuits, we mark all the signals whose values are specified by the given test vector, and augment the test generator to backtrack when any objective requires a value that conflicts with the value on a marked signal. For sequential circuits, however, there are some additional issues that need to be addressed, as illustrated below.

It is known that sequential test generators based on the iterative array model of the circuit process time-frames in several different ways. Good sequential test generation algorithms have been developed by processing the time-frames in strict backward time, strict forward time or a combination of forward and backward time processing of time frames. Consider a primary test sequence consisting of of n vectors, labeled $V_1 \ldots V_n$, that was derived by a sequential test generator to detect a target fault. Clearly, the test generator processed n time frames and the target fault is detected after the application of the vector $V_n$. Before performing secondary test generation, we simulate the good circuit with the primary test sequence to determine the logic values that signals in the circuit can assume for various time frames. As before, the signals that assume known values under the primary test sequence cannot be changed during secondary test generation.

When the primary test sequence is extended, it is possible that a new fault (that is not detected by the original sequence) can now be detected but this fault may require observation of the fault-effect at some vector other than $V_n$. Therefore, if we insist on fault detection at vector $V_n$, it is possible that the secondary test generation phase will be unable to extend the primary test sequence to detect additional faults. The following example illustrates this point. We consider a sequential test generator that processes time frames in strict backward time. Therefore, for this test generator, the anchor frame is also the frame in which the target fault will be detected. This test generator will derive test vectors in the reverse order of test application. We assume the same frame of fault detection for the primary test sequence and all its extensions.

Example 6

Figures 12, 13:
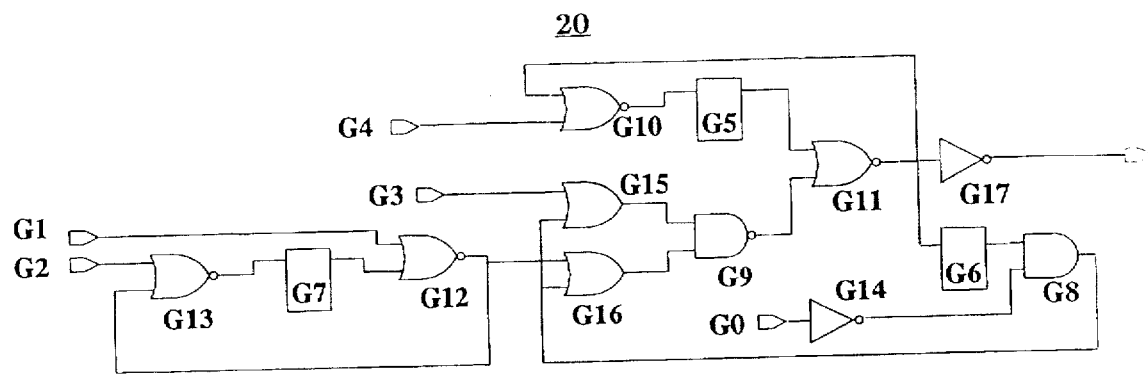
FIG. 12 is another sequential circuit used in describing the sliding anchor frame technique of the invention.
FIG. 13 shows a test sequence applicable for testing for the fault indicated in the circuit of FIG. 12.
Figure 14:
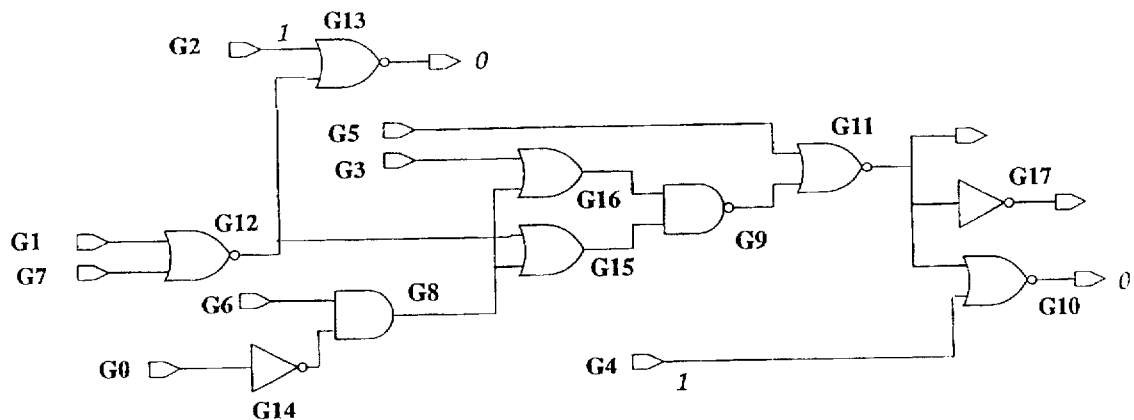
FIGS. 14 and 15 show the response of the circuit of FIG. 12 to the first and second vectors of the table 10 of FIG. 13.
Figure 15:
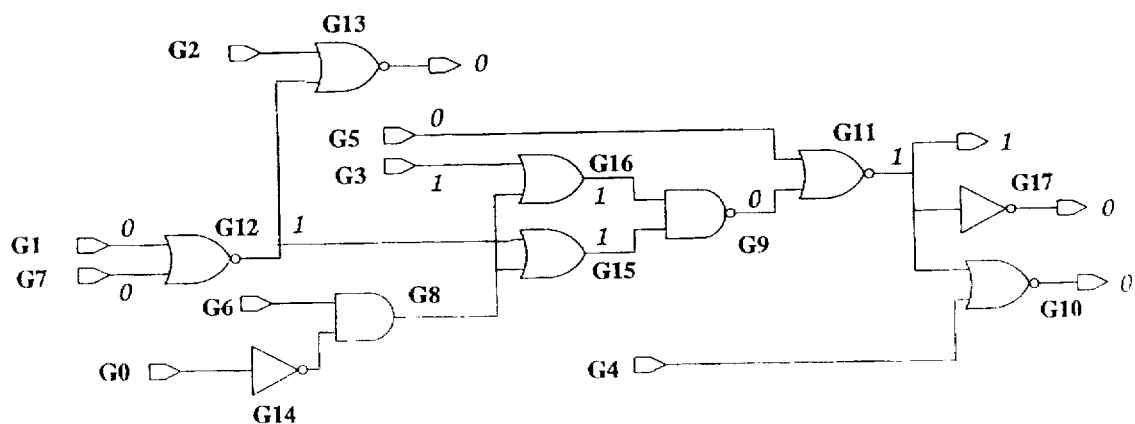

Consider the circuit 20 shown in FIG. 12 that is a slightly modified version of the circuit 10 that was shown in FIG. 1. The original circuit 10 was modified by replacing the input to G10 (that originally came from G14) with a new primary input G4. Consider the test sequence given in Table 10 of FIG. 13 that was generated to detect the fault, G15 stuck-at 1. The good circuit response to the first and second vectors of the sequence is shown in FIGS. 14 and 15, respectively. It can be seen that the fault causes output G17 to assume a value of 1 in the second time-frame. Suppose it is desired to perform secondary test generation with the primary test sequence as the one shown in Table 10 of FIG. 13, and let the secondary fault be G11 stuck-at 1. Let us consider the second frame as the frame of detection. Since G11 assumes a value of 1 in the second time frame (which is same as the faulty value), the fault cannot be excited in the second frame. A fault effect from the first frame can be propagated to next state variable G11, which corresponds to present state variable G16. However, this fault effect is killed due at gate G18 in the second frame. Thus, secondary test generation fails to extend the primary test sequence to detect the secondary target fault.

We tackle the above problem by performing multiple attempts to extend the given primary test sequence to detect the secondary fault—each time, we slide the anchor frame by allowing a different vector from the primary test sequence to align with the frame of detection for the secondary fault. First, we assign the last vector $V_n$ to be the anchor vector and attempt to extend the primary input sequence. If no such extension is possible, we then allow vector $V_{n-1}$ to be the anchor frame or the frame of detection. Eventually, we consider every vector as an anchor vector. If secondary test generation is unable to extend the primary test sequence by considering all anchor vectors, then the primary test sequence cannot be extended to detect any secondary target fault.

Figures 16, 17:
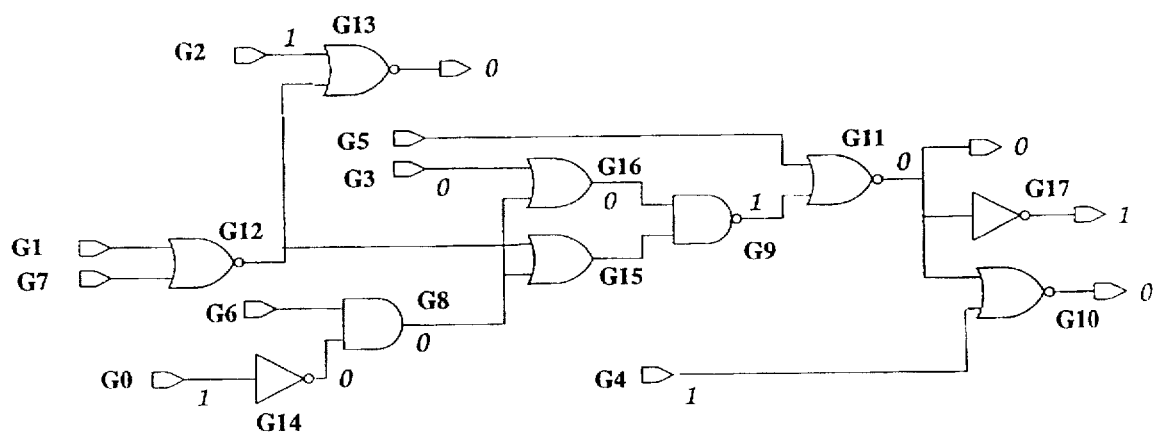
FIG. 16 shows a test sequence for use with the circuit of FIG. 13.
FIG. 17 illustrates the response of the circuit of FIG. 13 to the input sequence of Table 11 shown in FIG. 16.

We next illustrate how the sliding anchor frame technique leads to the primary test sequence of Table 10 being successfully extended to detect the fault G11 stuck-at 1. As explained earlier, we fail to generate a test that detects this fault in the second time frame frame. We now consider the first frame as the anchor frame. The test generator is now allowed to use only one vector to detect the fault G11 stuck-at 1, with the additional condition that the vector should be an extension of the first vector of the primary test sequence given in Table 10. For this example, an extension is possible. The extended test sequence is shown in Table 11. The response of the circuit to the first vector of the extended sequence is shown in FIG. 17. It can be easily seen that the fault effect is observed at the primary output G17.

Minimality of Test Set

Static compaction techniques are usually employed to reduce the number of vectors in a test set. These approaches select a subset of test sequences from a given test set that detects all faults in a target list of faults. The minimum subset of test sequences not only detects all target faults, but it also has the least number of vectors among various subsets of test sequences that detect all target faults. The minimum subset selection problem is known to belong to the class of NP-Hard problems. One heuristic is to perform reverse fault simulation, as discussed in the earlier mentioned paper by M. H. Schulz et al. Note that these methods do not modify any vector in the test set. In particular, they do not attempt to specify values to unspecified signals in the test sequences in order to merge test sequences.

The test set obtained using the bottleneck elimination approach is a minimal test set. This is because the test set cannot be further reduced using subset-selection, set-covering, or extended set-covering compaction approaches.

Theorem 1: A test set derived using procedure BOTTLENECK_FRAMEWORK cannot be further compacted using a subset-selection approach.

Proof: Let the test set consist of sequences $T_1 \ldots T_n$. Without loss of generality, assume that these sequences are ordered such that sequence $T_i$ is generated after sequence $T_{i-1}$. The theorem is proved by mathematical induction.

Basic step:

Consider the generation of sequence $T_2$. The primary test sequence corresponding to sequence $T_2$ detects at least one fault that is not detectable by sequence $T_1$. This is because the procedure BOTTLENECK_FRAMEWORK generates a primary test sequence only for a fault that is not detected by earlier generated test sequences. Also, since sequence $T_1$ was not dropped after the generation of sequence $T_2$, sequence $T_1$ detects an essential fault. Therefore, sequences $T_1$ and $T_2$ cannot be further compacted using subset-selection approaches.

Induction:

Consider the sequences $T_1 \ldots T_{i-1}$ that cannot be further compacted by a subset-selection approach. Therefore, every one of these sequences has a fault that is not detected by any other sequence in this set. We show that the set $T_1 \ldots T_{i-1}$, $T_i$ cannot be further compacted. The procedure BOTTLENECK_FRAMEWORK generates the next sequence $T_i$ by considering a fault that is not detected by any of the sequences $T_1 \ldots T_{i-1}$. Therefore, the sequence $T_i$ cannot be dropped while compacting the sequences $T_1 \ldots T_i$. Also, none of the sequences $T_1 \ldots T_{i-1}$ are dropped after the generation of the sequence $T_i$. This is because, if they were dropped, then they will not belong to the test set obtained by the bottleneck elimination approach. Therefore, sequences $T_1 \ldots T_i$ have at least one essential fault each. Hence, the sequences $T_1 \ldots T_i$ cannot be further compacted.

Several methods have been proposed that modify the test set during static vector compaction. A popular technique is to randomly or judiciously specify unspecified signals so that in order to drop test vectors or sequences from the test set. This technique has been used for vector compaction in combinational [3] and sequential [20] circuits. These techniques are examples of extended set-covering approaches.

Theorem 2: A test set $T_1 \ldots T_n$ that is derived using procedure BOTTLENECK_FRAMEWORK cannot be further compacted using an extended set-covering approach if the following conditions are satisfied during the generation of sequence $T_i$, $1 \leq i \leq n$:

1. Procedure EXTEND_SEQUENCE considers all faults not detected by sequences $T_1 \ldots T_{i-1}$ while extending the primary test sequence.
2. Procedure BOTTLENECK_FRAMEWORK considers all essential faults of sequences $T_1 \ldots T_{i-1}$.

Proof: Without loss of generality, we assume that sequence $T_i$ is generated after sequence $T_{i-1}$. Again, we use mathematical induction as the main proof technique.

Basis step:

Consider the generation of test sequence $T_2$. Procedure BOTTLENECK_FRAMEWORK ensures that the primary sequence corresponding to $T_2$ detects a fault $f_2$ that was not detected by sequence $T_1$. Furthermore, no specification of values for the unspecified signals in sequence $T_1$ will detect fault $f_2$. This is because, during the generation of sequence $T_1$, procedure EXTEND_SEQUENCE did attempt to extend sequence $T_1$ to detect fault $f_2$ and it failed. Otherwise, $f_2$ will not be considered as the next undetectable fault for generating the sequence $T_2$.

Since $T_1$ is included in the test set obtained using procedure BOTTLENECK_FRAMEWORK, sequence $T_1$ has an essential fault $f_1$ that cannot be detected by sequence $T_2$. Furthermore, no specification of values for the unspecified signals in sequence $T_2$ will detect fault $f_1$. This is because, during the generation of sequence $T_2$, procedure ELIMINATE_BOTTLENECKS did attempt to extend sequence $T_1$ to detect fault $f$ and it failed. Otherwise, $f_1$ is no longer an essential fault of sequence $T_1$ and this contradicts our assumption about $f_1$ being an essential fault.

Therefore, sequences $T_1$ and $T_2$ detect faults $f_1$ and $f_2$, respectively, that are not only essential but $f_1$ ($f_2$) cannot be detected by any specification of unspecified signals in sequence $T_2$ ($T_1$). This implies that sequences $T_1$ and $T_2$ cannot be a subsequence of each other by any specification of unspecified signals in these sequences. Hence, extended set-covering approaches will not be able to compact these sequences.

Induction:

Consider sequences $T_1 \ldots T_{i-1}$. These sequences cannot be further compacted using an extended set-covering approach. Let $f_i$ be the target undetected fault for generating sequence $T_i$. Clearly, during the generation of sequences $T_1 \ldots T_{i-1}$, procedure EXTEND_SEQUENCE attempted to extend the sequences to detect fault $f_i$ and it failed. Otherwise, fault $f_i$ would not be an undetected fault. Therefore, sequence $T_i$ cannot be a subsequence of any of the sequences $T_1 \ldots T_{i-1}$, for any specification of unspecified values in sequences $T_1 \ldots T_i$.

Consider any sequence $T_j$ from the set of sequences $T_1 \ldots T_{i-1}$. Since this sequence is part of the test set obtained using the procedure BOTTLENECK_FRAMEWORK, it must have an essential fault $f_j$. During the generation of sequence $T_i$, procedure ELIMINATE_BOTTLENECKS considered fault $f_j$. It attempted to extend sequence $T_i$ to detect fault $f_j$ and it failed. Therefore, sequence $T_j$ cannot be a subsequence of sequence $T_i$ for any specification of values for unspecified signals in sequences $T_j$ or $T_i$.

Therefore, sequences $T_1 \ldots T_i$ cannot be subsequences of each other for any specification of unspecified values. By induction, this establishes that extended set-covering approaches cannot further compact the test set derived using procedure BOTTLENECK_FRAMEWORK.

Under the partial scan-in and scan-out model, we can similarly show that the scan-in and scan-out cycles required for any vector (sequence) in a test set produced by procedure BOTTLENECK_FRAMEWORK cannot be further reduced by set-covering or extended set-covering approaches. However, as explained above, test application cycles of the test set also depend on the order in which test vectors (sequences) are applied. The problem of ordering the test vectors (sequences) to minimize total test application cycles can be shown to be NP-Hard, by reduction from the directed Hamiltonian path problem. We implemented a simple procedure that uses a greedy heuristic to order test vectors (sequences) to minimize test application cycles after the generation of the test set. In practice, we found that for all the circuits that we experimented with, this procedure resulted in ordered test sets that were within 5% of the lower bound described above.

Recently, a static compaction method for combinational circuits has been proposed that replaces existing test vectors in a test set with entirely new test vectors that are obtained by using a test generator (Kajihara et al. supra). For sequential circuits, static compaction techniques that significantly modify the test sequences in a test set have also been proposed (Niermann et al. supra). During the generation of a test set, a prior test sequence may satisfy both conditions SCB1 and SCB2, but it may be possible to eliminate one or more vectors in the sequence without compromising the detection of any essential fault. However, this can happen only if the the prior test sequence is modified after it has been generated. These techniques do not fall into the category of set-covering or extended set-covering approaches. Such static compaction approaches can be applied to further reduce the size of test sets derived by procedure BOTTLENECK_FRAMEWORK.

For large circuits, these vector compaction techniques can require higher computation times than the underlying test generator. The increase in computation times is mainly due to the large number of faults that have to be processed by a test generator that also performs the vector compaction. It is possible to reduce the computation times by trading off test generation time for test set size.

Alternatively, we have devised techniques that exploit three characteristics of dynamic vector compaction to reduce the test generation time without compromising the quality of the test sets obtained. These important characteristics of dynamic vector compaction are: (1) a large number of test vectors that are fault simulated during dynamic compaction are partially specified; (2) many of the faults considered for extending a current partially specified test vector are usually not detectable by any extension of the test vector; and (3) extension of a test vector is an incremental process. Our acceleration techniques are based on the following ideas: (1) identification of support sets, (2) target fault switching, and (3) use of dynamic equivalent and untestable fault analysis. All these techniques are useful in significantly reducing the number of faults that have to be considered by a test generator in a dynamic vector compaction system. Support sets are also useful in reducing the number of faults that have to be considered for fault simulation. Unlike critical path tracing that identifies a subset of faults that are guaranteed to be detectable by a given input sequence, support sets identify a large subset of faults that are guaranteed to be undetectable by the input sequence.

A technique to identify faults that are guaranteed to be undetectable by a given input vector has been proposed in a paper by S. B. Akers et al. entitled "Why is Less Information from Logic Simulation more useful in Fault Simulation?" in Proc. of the International Test Conference, pp. 786–800, 1990, for speeding up fault simulation in combinational circuits. They consider fully specified input vectors. Their technique cannot be directly used for fault simulation in a compaction environment since a majority of the vectors that are fault simulated during dynamic vector compaction are only partially specified. We compute support sets for partially specified vectors as well, allowing us to significantly reduce the computation effort required for fault simulation during dynamic vector compaction. We also use support sets to accelerate test generation during dynamic compaction. A theoretical basis is presented for computing support sets for sequential circuits, with applications to fault simulation and test generation during dynamic compaction for sequential circuits.

Consider a vector v that produces a response of 0 or 1 at a primary output Z of a combinational circuit. The input vector may or may not be fully specified. A support set for the primary output Z is any set of signals (including primary inputs) that satisfy all the following conditions:

SS1 All signals in the set assume a logic value 0 or 1.
SS2 The primary output Z is a member of the set.
SS3 The logic value on any signal (except a primary input) in the support set is uniquely determined by values of other signals in the support set.

Figures 18, 19:
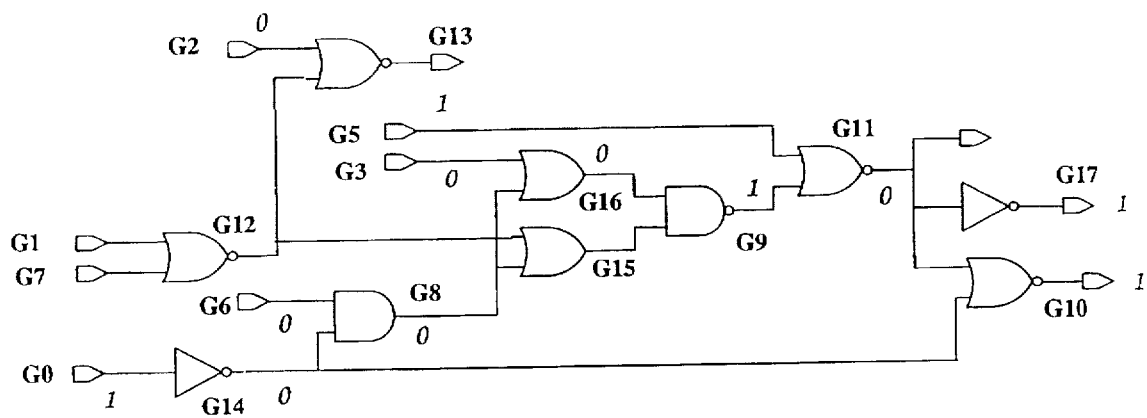
FIG. 18 is a combinational circuit that will be useful in describing the acceleration techniques for dynamic vector compaction that form a supplemental feature of the invention.
FIG. 19 shows a test vector for a particular fault in the circuit of FIG. 18.

A support set is minimal if no signal in the set can be deleted without violating conditions SS2 or SS3. A minimum support set has the least cardinality among all possible support sets. As an example, consider the combinational logic of circuit 30 that is shown in FIG. 18. The circuit response to the input vector of Table 12 of FIG. 19 is also shown in FIG. 18. Only signals that assume a logic value of 0 or 1 are marked with their respective values in the figure (the remaining signals assume unknown values). One possible support set for the primary output G17 consists of three signals G5, G11 and G17. Since these signals assume known logic values and the set includes G17, this set satisfies conditions SS1 and SS2. Also, the value of signal G11 is uniquely determined by the value of signal G5 and the value of primary output G17 is uniquely determined by the value of signal G11. Therefore, this set also satisfies condition SS3. The support set for primary output G17 is also minimal. This is because if we delete signal G5 (G11) from the set, then the value of signal G11 (G17) is not uniquely determined by value of other signals in the support set and we violate condition SS3. If we delete G17, we violate condition SS2. Therefore, no signal can be deleted from the support set. Note that a primary output can have several support sets. For example, two possible support sets for primary output G11 are as follows: {G5, G11} or {G0, G14, G8, G3, G16, G9, G11}. In the case of multiple primary outputs, condition SS2 is modified to require that each of the primary outputs be included in the support set. As an example, consider again the circuit of FIG. 18. The support sets for primary outputs G11, G17 and G10 are {G5, G11}, {G5, G11, G17}, and {G0, G5, G11, G14, G10}, respectively. Therefore, the support set for the circuit is {G0, G5, G10, G11, G14, G17}. Again, this set is minimal. This is because, if we delete any signal then it can be shown that we violate one or more of conditions SS2 and SS3.

It is desirable to compute a support set with small cardinality as this leads to greater savings in test generation and fault simulation time. However, attempting to compute the minimum support set for each input vector is computationally expensive. This overhead can more than offset the savings that can be obtained by using the support set. Our method to efficiently compute a minimal support set is shown in FIG. 20, as procedure COMPUTE_SUPPORT_SET(). This procedure takes a list of primary outputs L with known logic values. We assume that the input vector has been simulated to determine the response of the circuit. We also assume that every gate in the circuit has been assigned an integer value (level) that is one more than the maximum level of any fanin of the gate. All primary inputs are at level 0. The support signals for a gate are the smallest subset of the gate's inputs that are required to uniquely determine the logic value of the gate. For example, consider an AND gate a that has two inputs b and c. Suppose that signals b and c assume the logic values 0 and 1, respectively. The support signal for gate a is signal b since the value on gate a is uniquely determined by signal b.

This procedure uses an array Larr of size equal to the maximum level (Maxlevel) assigned to any signal in the circuit. Larr[i] is a list that contains a subset of the set of signals that are assigned the level i. Initially, all lists in Larr are empty. We illustrate the execution of the procedure by an example. Consider the computation of support set for primary output G10 in FIG. 18. For this example, signals G10, G11, G5, G14 and G0 are assigned levels 6, 5, 0, 1 and 0, respectively. Here, Maxlevel is 6. We begin by including G10 in the support set S. Since G10 is at level 6 we include it in the list Larr[6]. We first process the signal G10 in the list Larr[6]. The support signals for gate G10 are G11 and G14. This is because both signals are necessary to uniquely determine the value of G11. We include G11 and G14 in the support set S. Signals G11 and G14 are also included in lists Larr[5] and Larr[1], respectively. We then process signals in list Larr[5]. Signal G11 can have either G5 or G9 as its support signal. This is because the value of gate G11 can be uniquely determined by either of its inputs. We make a choice of the support signal as follows. If one of the support signals of the gate has already been included in the support set of the circuit, then this signal is selected as the support signal for the gate. Otherwise, we choose a support signal at the lowest level. In this example, we select G5 as the support signal since it is at a lower level than G9. This heuristic helps in generating support sets with few signals. We move on to the signal G14 that is in the list Larr[1]. The support signal for G14 is G0. We include G0 in the support set S. Since all lists in the array Larr are now empty, we terminate the procedure. The set S forms a minimal support set for the primary output G10.

Figure 22:
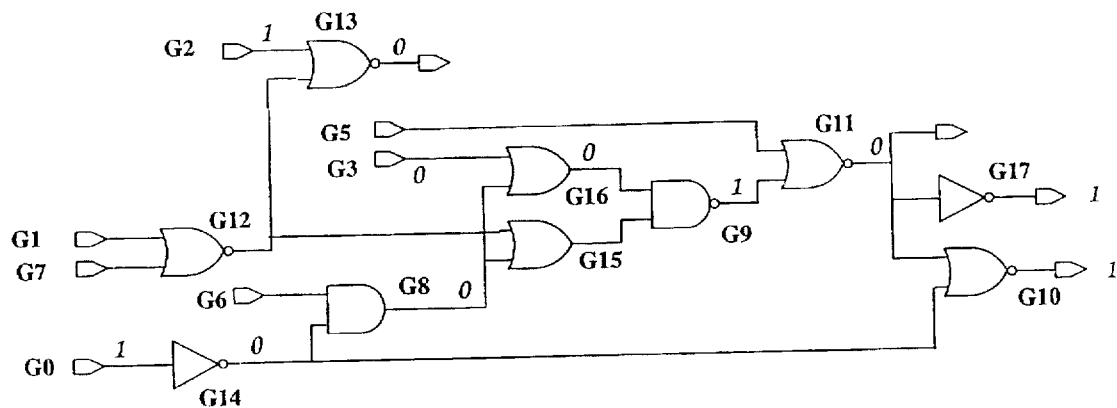
FIGS. 22 and 23 illustrate the response of the circuit of FIG. 18 to the first and second vectors, respectively, of the test sequence of the table of FIG. 19.
Figure 23:
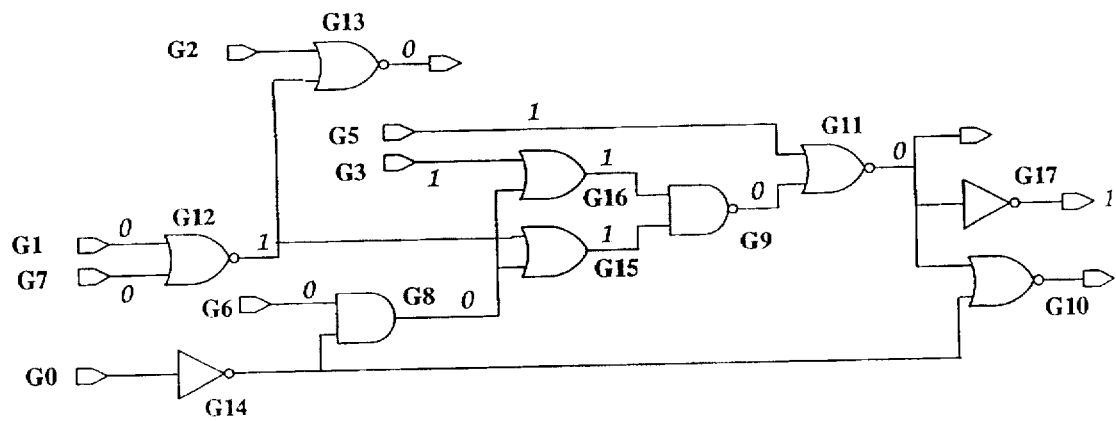

Support sets can also be computed for sequential circuits. As an example, consider the input sequence shown in Table 13 of FIG. 21. This sequence has two input vectors and it is applied to the sequential circuit 10 that was first shown in FIG. 1. We compute support sets for the combinational logic for each input vector, and use these sets to derive the support set for the sequence. For the first vector, we simulate the circuit with all state variables in an unknown state. The logic values assumed by signals for the first vector are shown in FIG. 22. The first vector initializes all state variables. The logic values assumed by signals for the second vector are shown in FIG. 23.

For computing support sets, we consider the vectors in reverse order. We first compute a support set for the last vector of the sequence, and then proceed backwards until we reach the first vector of the sequence. As an example, consider the second vector in the sequence shown in Table 13. The circuit response for this vector is shown in FIG. 23. The support set $S_2$ for this vector is computed by using the procedure COMPUTE_SUPPORT_SET ($P_2$). Here, the list $P_2$ consists of only the primary output signal G17. This is because for the last vector of any sequence, the support set is computed by only considering primary outputs that assume a logic value of 0 or 1. Next state variables with known logic values are not considered in computing the support set for the last vector. The support set $S_2$ consists of the signals G17, G11, and G5. Note that the cardinality of the support set significantly smaller than the total number of signals in the circuit.

After computing the support set $S_2$, we move on to the the first vector. The circuit response for this vector is shown in FIG. 22. The support set $S_1$ for this vector is computed using procedure COMPUTE_SUPPORT_SET ($P_1$). The list $P_1$ includes all primary outputs that have a logic value of 0 and 1. In addition, $P_1$ also includes any next state variable v that satisfies the following two conditions:
C1 Next state variable v is at a logic value of 0 or 1.
C2 The present state variable corresponding to v is included in the support set computed for vector 2.

Since the support set of vector 1 is computed after we process vector 2, it is easy to verify if a next state variable satisfies the condition C2. For the current example, the primary output G17 is included in $P_1$ since it assumes a logic value of 1. Also, all next state variables G10, G11, and G13 assume known logic values. Hence, condition C1 is satisfied for all these signals. As shown in FIG. 1, the present state variables corresponding to G10, G11, and G13 are G5, G6, and G7 respectively. Of these, only G5 is in the support set $S_2$. Hence, only signal G10 satisfies condition C2. We include G10 in the list $P_1$. The support set $S_1$ as computed by procedure COMPUTE_SUPPORT_SET ($P_1$) consists of the following signals: G10, G17, G11, G9, G16, G8, G14, G3, and G0. Although not applicable for the present example, if the input sequence consists of many vectors, the last vector is processed similar to the second vector in the present example. All other vectors are processed using a method to similar to the one used for the first vector.

Dynamic vector compaction methods incrementally extend a test sequence. This can be exploited to efficiently compute support sets in an incremental way as explained below. When new primary outputs are set as a result of an extension of a test sequence, the procedure COMPUTE_SUPPORT_SET (P) is called with the list P containing only those primary outputs that have been set to a logic value of 0 or 1 as a result of the last extension. Thus, the added overhead for support set computation is minimal.

Fault Simulation

Fault simulation is used in test generators to reduce the number of faults for which test sequences have to be derived by the test generator. For static and dynamic compaction methods, fault simulation is also used extensively to compute essential faults. In dynamic compaction methods, a partially specified test sequence may be extended several times by the test generator and fault simulation is performed for every extension of the test sequence. As shown above, the number of faults processed during dynamic compaction can be very large. We show that support sets can significantly reduce the number of faults that have to be considered for fault simulation. Theorem 3 provides the theoretical basis for identifying a large set of faults that are guaranteed to be undetectable by a given test vector. This theorem applies to combinational circuits.

Theorem 3: Consider a combinational circuit C and a test vector T. Let S be the support set computed for the primary outputs with 0 or 1 logic value. If signal g is not in the support set S, then a stuck-at 0 or stuck-at 1 fault on signal g cannot be detected by vector T.

From Theorem 3, faults on signals that are not in the support set don't have to be fault simulated for T or any of its extensions. A fault on the fanout branch of signal a to signal b need not be considered if either a or b is not in the support set S. Consider again the circuit shown in FIG. 1. The support set is computed for the primary outputs G10, G11, and G17. This is because they assume a logic value of 0 or 1. The support set S consists of the signals, G10, G11, G17, G5, G14, and G0. Only faults on these signals need to be considered for fault simulation. For the circuit shown FIG. 1, the collapsed fault list consists of 32 faults. Of these, it turns out that only 13 faults have to be considered for fault simulation.

Support sets can also be used for reducing the number of faults considered in dynamic compaction for sequential circuits. Theorem 4 provides the theoretical basis for sequential circuits.

Theorem 4: Consider a sequential circuit C and a test sequence T that consists of n vectors, $T_1 \ldots T_n$. Let $S_1 \ldots S_n$ be the support sets for the circuit corresponding to vectors $T_1 \ldots T_n$, computed as explained earlier. Let S be the set formed by taking the set union of $S_1 \ldots S_n$. If signal g is not in the support set S, then a stuck-at 0 or stuck-at 1 fault on signal g cannot be detected by the sequence T.

As an illustration of Theorem 4, consider again the sequential circuit 10 shown in FIG. 1 and the sequence given in Table 13. The circuit response to the first and second vectors of the sequence are shown in FIGS. 22 and 23, respectively. The support sets $S_1$ and $S_2$ for the first and second vectors were previously computed earlier. The set S formed by taking the union of sets $S_1$ and $S_2$ consists of signals G10, G17, G11, G9, G16, G8, G14, G5, G3, and G0. Using Theorem 4, it can be shown that we can rule out 9 out of the 32 faults in the collapsed fault list. These 9 faults do not have to be considered in fault simulation. Note that Theorems 3 and 4 do consider the propagation of fault effects along multiple re-convergent paths. This is because, during the computation of the support sets, we add a fanout stem signal to the support set if any of its branches have already been included in the support set. In fact, the support sets computed by procedure COMPUTE_SUPPORT_SET() are pessimistic in the sense that faults on signals in the support set may be undetectable.

Test Generation

The main loop in dynamic compaction methods consists of the following two steps: (1) generate a test sequence for a target fault, and (2) extend the test sequence by suitably specifying unspecified primary inputs in the test sequence. By suitably assigning values to unspecified primary inputs, several other faults can be detected by the test sequence. The fault considered in the first step is referred to as the primary target fault, while faults that are considered in the second step are called secondary target faults (or secondary faults). As shown earlier, the number of secondary faults can be very large. Support sets are useful in significantly reducing the number of secondary faults. In order to use support sets for secondary fault elimination, we generalize the concept of support sets to cover signals that assume logic values X. This extension is necessary because faults on signals that are at a logic value of X may be detectable by a suitable extension of the test vector. The definition of extended support sets is given below.

SS1 All signals in the set assume a logic value 0, 1 or X.
SS2 The primary output Z is a member of the support set.
SS3 The logic value on any signal (except a primary input) in the support set is uniquely determined by logic values of other signals in the support set.

The procedure COMPUTE_SUPPORT_SET (P) described earlier can still be used with one difference—the list P contains all primary outputs. The definition of support signals for a gate is also extended as follows. For a gate g that is at a logic value of X, all inputs of the gate are considered to be support signals. All references to support sets in this subsection are to the extended definition given above.

Our next result shows how to use support sets for reducing the test generation effort involved in dynamic vector compaction. Theorem 5 identifies a large subset of faults in the circuit that do not have be considered as secondary faults while extending a given partial test vector.

Theorem 5: Consider a combinational circuit C and a test vector T. Let S be the extended support set of the circuit. If signal g is not in the support set S, then a stuck-at 0 or stuck-at 1 fault on signal g cannot be detected by any extension of vector T.

As an example, consider again the circuit of FIG. 17. The target (collapsed) fault list consists of 32 faults. Consider the situation when the input vector of Table 12 is extended to detect other faults. The logic values assumed by signals for the input vector of Table 12 are shown in FIG. 16. The support set of the circuit, as computed, consists of the signals G10, G11, G17, G5, G14 and G0. If we also consider primary output signal G13 (whose value is X), then signals G13, G12, G7, G2 and G1 are also added to the support set. Only faults on these signals need be considered as secondary faults. For example, fault G8 stuck-at 1 need not be considered as a secondary target fault for test generation. For this circuit, it turns out that 11 of the 32 faults in the target fault list do not have to be considered as secondary faults in trying to extend the input vector of Table 12.

Support sets are also useful for reducing the number of secondary faults in sequential circuits. Theorem 6 provides the basis for secondary fault elimination in sequential circuits. Consider a sequential circuit C and a test sequence T that consists of n vectors, $T_1 \ldots T_n$. Let $S_1 \ldots S_n$ be the extended support sets for the circuit corresponding to vectors $T_1 \ldots T_n$, computed as explained below. The computation of the support sets $S_1 \ldots S_n$ is similar to the computation illustrated in Section 3.1, with some important differences. As before, we proceed in the reverse order of the vectors, i.e., we generate $S_n \ldots S_1$ in that order. For generating $S_n$, the procedure COMPUTE_SUPPORT_SET ($P_n$) is used where $P_n$ contains all the primary output signals, irrespective of their logic values. $S_i$ ($0 \leq i \leq n-1$) is computed by calling the procedure COMPUTE_SUPPORT_SET ($P_i$); where $P_i$ consists of both primary outputs and next state variables. All primary outputs are included in $P_i$ irrespective of their logic value. Each next state variable v that satisfies the following condition is included in $P_i$.

C1 The present state variable corresponding to v is included in the support set $S_{i+1}$ computed for vector $T_{i+1}$.

Theorem 6: Consider a sequential circuit C and a test sequence T that consists of n vectors, $T_1 \ldots T_n$. Let $S_1 \ldots S_n$ be the extended support sets for the circuit corresponding to vectors $T_1 \ldots T_n$. Let S be the set formed by taking the set union of $S_1 \ldots S_n$. If signal g is not in the support set S, then a stuck-at 0 or stuck-at 1 fault on signal g cannot be detected by any extension of the sequence T.

For example, consider again the circuit responses of circuit of FIG. 1, that are shown in FIGS. 22 and 23. The support set $S_2$ corresponding to the second vector (which is the last vector of the sequence) is computed for only the primary output signal G17, and consists of signals G17, G11, and G5. We next proceed to compute $S_1$, the support set corresponding to the first vector of the sequence. Next state variables G10, G11, and G13 correspond to present state variables G5, G6, and G7, respectively. Only G5 is included in $S_2$. Hence $S_1$ is computed for the primary output signal, G17, and the next state variable G10. The set $S_1$ consists of the signals G17, G10, G11, G9, G16, G8, G14, G3, and G0. The set S is the set union of $S_1$ and $S_2$. Only faults on signals in S are considered as secondary faults. For example, fault G2 stuck-at 0 need not be considered as a secondary fault since Theorem 6 rules out the possibility of detecting it by extending the partially specified sequence of Table 13. Note that if the first vector alone is considered, it can be extended so that the fault effect reaches the next state variable G13. However, this fault effect cannot be propagated to the primary output G17 by any extension of the second vector. For this circuit, the target fault list has 32 faults. After applying Theorem 6, it can be verified that 12 of the 32 target faults cannot be detected by any extension of the given sequence.

Dynamic Fault Equivalence

Figures 24, 25:
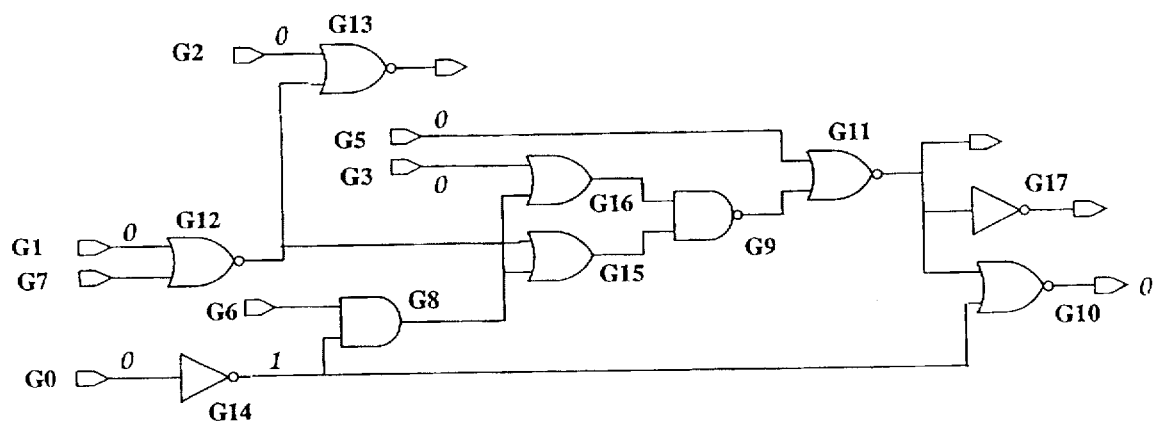
FIG. 24 is a table showing a test vector used for illustrating dynamic fault equivalence.
FIG. 25 illustrates the response of the circuit of FIG. 18 to the vector shown in FIG. 24.

Two faults, $f_1$ and $f_2$ are equivalent if any test sequence that detects $f_1$ also detects $f_2$ and vice-versa. By computing such equivalent faults, we can reduce the number of faults that have to be considered for test generation and fault simulation. If a partially specified vector has to be fault simulated or further extended (as is the case in dynamic compaction), the partially specified values in the circuit may lead to new equivalent faults. To see this, consider the circuit of FIG. 25. This figure also shows the signal values for the input vector given in Table 14 of FIG. 24. Consider faults G7 stuck-at 0 and G12 stuck-at 1. These faults are not equivalent. However, since G1 assumes a logic 0, these two faults now become equivalent. This is because any test for G12 stuck-at 1 that is derived by extending the partial vector of Table 14 must set G7 to a 1 and propagate the fault effect from G12 to a primary output. These are also the conditions for any test vector for G7 stuck-at 1. Therefore, the faults G7 stuck-at 0 and G12 stuck-at 1 are dynamically equivalent. Given a partially specified input vector, the target fault list can be further collapsed based on signals that assume known values. This situation occurs often in dynamic compaction. For example, the initial collapsed fault list for the circuit shown in FIG. 25 consists of 32 faults. Given the vector of Table 14, we can compute additional equivalent faults. For this example, we can collapse the fault list to contain only 27 faults. Dynamic equivalences contribute to a reduction in the number of faults considered for both test generation and fault simulation.

Untestability Analysis Using X-Path Check

The concept of X-path check can be used to further reduce the number of secondary faults processed. Consider a combinational circuit C, a test vector T that may be partially specified, and a candidate fault g stuck-at v (g is a signal in the circuit and v is either 0 or 1). The X-path check assumes a knowledge of the good circuit response to T. The X-path check starts from the fault site, g, and searches for a path P to a primary output such that for each gate g' on the path, one of the following conditions is true:

Either The output of g' is at a logic value of X in the good circuit.

Or Each side input s of g for which there is no path from the fault site to s has either a non-controlling value or a value of X.

The X-path check was used in PODEM [15] for guiding the branch and bound process during test generation. We use it in a different context, to efficiently identify faults that cannot be detected by any extension of a given partial vector. Knowledge of the good circuit response to the vector T is a pre-requisite for the X-path check. However, this does not impose any overhead in practice as these values are readily available from the fault simulation performed for T before the next extension of T is attempted. It is important to note that the presence of an X-path is not sufficient to guarantee that a test can be derived for the fault by extending the partial vector T. However, failure of the X-path check does imply that it is futile to attempt an extension of T to detect the fault being considered. This significantly reduces the number of unnecessary test generation attempts, thus making the compaction procedure more efficient.

Target Fault Switching

If the target fault list has an untestable fault f, then f may be considered during the extension of several test sequences before it is proven untestable. This happens because a failure to generate a test for f by extending a partially specified sequence $T_1$ does not say anything about the testability of f for another partial sequence $T_2$. In order to prove f as untestable, it is necessary to consider f as a primary target fault. Thus, a fault could be considered several times as a secondary target fault before it is detected or proven undetectable by considering it as a primary target fault. This contributes to an increase in the number of faults that are processed by the test generator. We use a simple heuristic to avoid repeated test generation attempts for such faults. If f is proven to be untestable by any extension of the current test sequence, then we consider f as the next primary target fault. It is important to note that since target fault switching occasionally selects a different primary target fault than would have been used otherwise, it nominally alters the fault ordering used by the dynamic compaction system. As a result, a potentially different test set may result when target fault switching is used. However, the change in the fault ordering thus caused is limited to very few faults, and does not affect the test set size significantly because most of the faults selected by this heuristic turn out to be indeed untestable. Hence, known fault ordering methods (as described in a paper by S. Kajihara et al, entitled "Cost-Effective Generation of Minimal Test Sets for Stuck-at Faults in Combinational Logic Circuits," in Proc. of the 30th ACM/IEEE Design Automation Conference, pp. 102–106, June 1993) can still be used along with target fault switching. In practice, it was observed that the slight re-ordering caused by the use of target fault switching has a negligible impact on the size of the test sets.

The target fault switching strategy is also useful for cases when the fault list has no untestable faults. If the underlying test generator generates tests by considering each primary output separately, then it is useful to establish if a given fault is untestable with respect to a particular primary output. If this is the case, then the fault does not have to be considered for all tests and their extensions that are derived by considering this primary output. We use the following heuristic to quickly identify such faults. If a fault f cannot be detected by any extension of an input vector for a given primary output O, then we consider f as the next primary target fault. The test generator attempts to establish f as untestable with respect to the primary output O. If f is established to be untestable with respect to O, we need not target f as a secondary fault for detection at O for the remaining vectors.

What is claimed is:

1. A process for dynamic test set compaction and reduction in an integrated sequential circuit said process comprising the steps of:

generating at least one test sequence for the circuit;

identifying, during said generating step, bottlenecks in each generated test sequence that prevent vector compaction and further test cycle reduction;

eliminating any identified bottlenecks from each generated test sequence;

removing from the test set, all test sequences for which all bottlenecks have been eliminated; and generating future test sequences that eliminate bottlenecks of the test set generated using a sliding anchor frame technique to specify unspecified bits in a partially specified test sequence.

2. The process of claim 1 in which the sliding anchor technique uses each vector in a partially specified test sequence as an anchor vector during extension of the test sequence.

3. The process of claim 1 that to facilitate vector compaction includes the step of computing support sets for identifying faults that cannot be detected by specifying unspecified input in given input test sequences.

* * * * *